(12) United States Patent
Sekimoto et al.

(10) Patent No.: US 7,420,784 B2
(45) Date of Patent: Sep. 2, 2008

(54) ROTATING DISK STORAGE DEVICE WITH HIGH RIGIDITY FLEXIBLE PRINTED CIRCUIT BOARD

(75) Inventors: Tatsuo Sekimoto, Kanagawa (JP);
Tomoki Hiramatsu, Kanagawa (JP);
Motoji Takemoto, Kanagawa (JP);
Tetsuo Yuki, Kanagawa (JP)

(73) Assignee: Hitchi Global Storage Technologies Netherlands B.V., Amsterdam (NL)

( * ) Notice: Subject to any disclaimer, the term of this patent is extended or adjusted under 35 U.S.C. 154(b) by 399 days.

(21) Appl. No.: 11/012,989

(22) Filed: Dec. 14, 2004

(65) Prior Publication Data
US 2005/0141141 A1 Jun. 30, 2005

(30) Foreign Application Priority Data
Dec. 25, 2003 (JP) ............................. 2003-430189

(51) Int. Cl.
*G11B 21/02* (2006.01)
(52) U.S. Cl. ..................................... 360/266
(58) Field of Classification Search .............. 360/264.2, 360/264.7
See application file for complete search history.

(56) References Cited
U.S. PATENT DOCUMENTS
6,166,888 A * 12/2000 Tsuda et al. .............. 360/264.2

6,721,135 B2 * 4/2004 Hong et al. ............... 360/264.2
6,754,045 B2 * 6/2004 Korkowski et al. ........ 360/245.9
6,771,470 B1 * 8/2004 Yagi ........................ 360/264.2

FOREIGN PATENT DOCUMENTS
| JP | 10-269720 A | 10/1998 |
| JP | 2001-344945 A | 12/2001 |
| JP | 2002-324389 A | 11/2002 |

\* cited by examiner

*Primary Examiner*—William R. Korzuch
*Assistant Examiner*—Mark Blouin
(74) *Attorney, Agent, or Firm*—Townsend and Townsend and Crew LLP; Duke Amaniampong (57) ABSTRACT

A flexible printed circuit board using a lead-free solder is to be fixed within a disk enclosure while ensuring a high rigidity. In one embodiment, a rotating disk storage device comprises a flexible printed circuit board (FPC), wherein there is formed a wiring pattern including a signal line for the transmission of a signal of data read by a head in an actuator head suspension assembly (AHSA) and wherein one side end portion is fixed to a base and an opposite side end portion is fixed to the AHSA. A first metallic plate and a second metallic plate are both fixed to one side end portion of the FPC. A connector is disposed in an area where the first metallic plate in the FPC is provided, and connected to the wiring pattern. A shock sensor is disposed in an area where the second metallic plate in the FPC is provided, and connected to the wiring pattern. A reinforcing plate of a synthetic resin is, in an opposed state of the first and second metallic plates fixed to one side end portion of the FPC, held between the opposed faces of both metallic plates and is fixed to the base together with both metallic plates.

19 Claims, 7 Drawing Sheets

ROTATING DISK STORAGE DEVICE WITH HIGH RIGIDITY FLEXIBLE PRINTED CIRCUIT BOARD

CROSS-REFERENCES TO RELATED APPLICATIONS

This application claims priority from Japanese Patent Application No. JP 2003-430189, filed Dec. 25, 2003, the entire disclosure of which is incorporated herein by reference.

BACKGROUND OF THE INVENTION

The present invention relates to a rotating disk storage device such as a magnetic disk drive or a magneto-optic disk drive wherein a flexible printed circuit board using a lead-free solder can be fixed within a disk enclosure while retaining a high rigidity.

A magnetic disk drive is generally composed of a head disk assembly (hereinafter referred to as "HDA") and a printed circuit board attached to the HDA. The HDA is of construction sealed with a disk enclosure in order to accommodate a magnetic disk, an actuator head suspension assembly ("AHSA"), a spindle motor, and an electronic component in a clean air atmosphere. The printed circuit board has an electronic component mounted thereon for controlling the operation of the magnetic disk drive and for the transfer of data. A flexible cable is disposed within the disk enclosure to connect the internal components accommodated in the disk enclosure with the printed circuit board electrically.

The flexible cable, which is also called a flexible printed circuit board or a flex cable, has a structure wherein plural conductors are held and insulated through a flexible sheet. It will hereinafter be referred to as FPC (flexible printed circuit).

As the magnetic disk drive using such an FPC there has been proposed, for example, one provided with an FPC assembly which includes an FPC with wiring patterns formed on a base film, a reinforcing film for reinforcing the FPC, and a reinforcing plate for reinforcing the FPC, the reinforcing plate being affixed to a laminated portion of both FPC and reinforcing film, and wherein there are formed a first mounting portion to be mounted to a side face of a carriage and a second mounting portion to be fixed to a base of an enclosure case (see, for example, Japanese Patent Application Laid Open No. 269720/1998).

As the magnetic disk drive using an FPC there also has been proposed one provided with a main FPC which has a base film, conductor patterns formed on the base film, and a cover layer covering the conductor patterns exclusive of pad portions and also covering the base film, and wherein there are formed an extending end portion attached to a carriage assembly (actuator head suspension assembly) and a base end portion attached onto a bottom wall of a case (see, for example, Japanese Patent Application Laid Open No. 344945/2001).

Such magnetic disk drives are generally provided with a shock sensor for detecting shock or oscillation applied thereto from the exterior. When the shock sensor detects a shock or oscillation larger than a threshold value, it can stop a recording operation of a head for a magnetic disk (see, for example, Japanese Patent Application Laid Open No. 173639/2003).

BRIEF SUMMARY OF THE INVENTION

It has recently been demanded that industrial products adapt themselves to the environment, and the influence of lead on the environment has become an issue. In Europe and various other countries there has been made an agreement to the effect that lead should not be used for industrial products to be produced in the future. For realizing a lead-free magnetic disk drive, it is necessary to make a switch from a eutectic solder using lead or tin, which is used in soldering electronic components as internal parts, to a lead-free solder not using lead. This is necessary for the development and manufacture of products taking environment into account.

In the magnetic disk drives of Japanese Patent Application Laid Open No. 269720/1998 and Japanese Patent Application Laid Open No. 344945/2001 referred to above, the portions mainly using a eutectic solder are a logic card and an FPC. Particularly, to the FPC there are soldered not only resistors and capacitors as electronic components, but also a shock sensor. More specifically, a eutectic solder is melted by reflow within a reflow furnace to solder resistors, capacitors, and a shock sensor to the FPC.

In the case of a eutectic solder, the melting point is about 180° C., but in the case of a lead-free solder, the melting point is as high as 220° to 230° C. and therefore the soldering work by the reflow must be done at a higher temperature than in the case of a eutectic solder.

Where a shock sensor is soldered to the FPC, in order that a mere deflection of the FPC may not cause operation of the shock sensor, there is adopted a structure wherein a reinforcing plate of a synthetic resin for imparting such a rigidity as prevents malfunction of the shock sensor is bonded to the shock sensor-fixed area of the FPC and the FPC is fixed through the reinforcing plate to a base of an enclosure case (onto a bottom wall of the case). In this case, a thermosetting adhesive is used lest a gas should be released into the enclosure. Therefore, the use of a eutectic solder permits bonding of the reinforcing plate to the FPC by reflow. However, the use of a lead-free solder results in the melting point being in the range of about 220° to 230° C., so that even if a polyether imide [trade name: ULTEM®] having a high heat resistance is used as a synthetic resin, the reinforcing plate when placed into a high-temperature reflow furnace will be deformed, making it difficult to fix the carriage and the FPC, or the base (an upper surface of the case bottom wall) and the FPC, to a satisfactory extent, with a consequent fear of causing various problems related to product reliability and productivity. Particularly, if the base-FPC fixing is not done to a satisfactory extent, the shock sensor disposed on the FPC will malfunction, which leads to a marked deterioration in performance of the magnetic disk drive.

For eliminating such a problem, it may be effective to reduce the temperature of the reflow furnace for bonding of the reinforcing plate made of a synthetic resin. However, the productivity is deteriorated because it is necessary to newly provide a reflow process involving a different temperature as a separate process. It also may be effective to use a thermoplastic adhesive or a synthetic rubber-based adhesive and conduct reflow at the same melting temperature as that of the lead-free solder. However, a drawback is encountered such that a gas as impurity present within the enclosure is released. Further, even if the reinforcing plate is constituted by a metallic plate, an increase in weight results.

Accordingly, it is a feature of the present invention to provide a rotating disk storage device having a structure which permits a flexible printed circuit board using a lead-free solder to be fixed within a disk enclosure while maintaining a high rigidity and without deterioration of productivity.

In a first aspect of the present invention there is provided a rotating disk storage device comprising a disk enclosure including a base; a rotating disk storage medium supported rotatably on the base; an actuator head suspension assembly having a head for reading data from the rotating disk storage medium; a flexible printed circuit board having a wiring pattern which includes a signal line for the transmission of a signal of the data read by the head, the flexible printed circuit board having a side end portion fixed to the base; a metallic plate fixed to the side end portion of the flexible printed circuit board; an electronic component disposed on the flexible printed circuit board in an area where the metallic plate is fixed, the electronic component being connected to the wiring pattern; and a reinforcing plate of a synthetic resin disposed adjacent the metallic plate and fixed to the base together with the metallic plate.

In some embodiments, a metallic plate is fixed to a side end portion of the FPC which is fixed to the base and an electronic component is disposed in the metallic plate-fixed area of the FPC, the metallic plate imparting rigidity to the electronic component. If a thermosetting adhesive is used at the time of fixing the metallic plate to the FPC, both soldering and bonding can be done simultaneously in the reflow process for connecting the electronic component to the wiring pattern. Moreover, since the reinforcing plate of a synthetic resin is of such a construction as is disposed by fitting or combination in adjacency to the metallic plate without using an adhesive, it is not necessary to let the reinforcing plate of a synthetic resin be exposed to the reflow process. Particularly, in case of using a lead-free solder high in reflow temperature, the FPC structure according to this first aspect is effective because the reinforcing plate of a synthetic resin cannot be bonded at the reflow temperature.

Among electronic components, particularly as to a shock sensor, if it is not mounted in an area having a predetermined rigidity, it will malfunction, with consequent deterioration in performance of the device. Thus, the FPC structure according to this first aspect which can prevent the occurrence of such a malfunction is effective. Since the reinforcing plate of a synthetic resin can be fixed to the base together with the metallic plate by a fitting structure, it is not necessary to use an adhesive, nor is it necessary to constitute the reinforcing plate by a heavy metallic plate.

In a second aspect of the present invention there is provided a rotating disk storage device comprising a disk enclosure including a base; a rotating disk storage medium supported rotatably on the base; an actuator head suspension assembly having a head for reading data from the rotating disk storage medium; a flexible printed circuit board having a wiring pattern which includes a signal line for the transmission of a signal of the data read by the head, the flexible printed circuit board having a side end portion fixed to the base; a first metallic plate and a second metallic plate both fixed to the side end portion of the flexible printed circuit board; a connector disposed on the flexible printed circuit board in an area where the first metallic plate is fixed, the connector being connected to the wiring pattern; an electronic component disposed on the flexible printed circuit board in an area where the second metallic plate is fixed, the electronic component being connected to the wiring pattern; and a reinforcing plate of a synthetic resin which, in an opposed state of the first and second metallic plates fixed to the side end portion of the flexible printed circuit board, is held between the opposed surfaces of the first and second metallic plates and is fixed to the base together with the first and second metallic plates.

In this second aspect the first and second metallic plates are opposed to each other and a reinforcing plate of a synthetic resin is held therebetween, then in this state the FPC is fixed to the base. Such a structure can save a planar space within the disk enclosure. In addition, the rotating disk storage device of this second aspect has the same features as in the first aspect. The connector is given a mounting rigidity by the first metallic plate and can be connected to the printed circuit board disposed outside the enclosure.

In a third aspect of the present invention there is provided a rotating disk storage device comprising a flexible printed circuit board assembly having a wiring pattern and a side end portion fixed to a base of a disk enclosure. The wiring pattern is adapted to transmit a signal of data read by a head from a rotating disk storage medium. The rotating disk storage medium is supported on the base rotatably. The flexible printed circuit board assembly comprises a flexible printed circuit board having an electronic component and a metallic plate, the electronic component being mounted to a surface of the side end portion with a lead-free solder, the metallic plate having a thermosetting adhesive applied thereto and being bonded to a back side of the side end portion in an area which includes the electronic component, The flexible printed circuit board assembly further comprises a reinforcing plate of a synthetic resin, the reinforcing plate being disposed adjacent the metallic plate which is in a fixed state and being fixed to the base together with the metallic plate, the disposing and fixing of the metallic plate being performed after the steps of placing the flexible printed circuit board into a reflow furnace in a state in which the electronic component is mounted on the flexible printed circuit board with a lead-free solder and the metallic plate is bonded to the flexible printed circuit board with the thermosetting adhesive, allowing the lead-free solder to the flexible printed circuit board, and allowing the thermosetting adhesive to cure to fix the metallic plate.

In a fourth aspect of the present invention there is provided a rotating disk storage device comprising a flexible printed circuit board assembly having a wiring pattern and a side end portion fixed to a base of a disk enclosure. The wiring pattern is adapted to transmit a signal of data read by a head from a rotating disk storage medium. The rotating disk storage medium is supported on the base rotatably. The flexible printed circuit board assembly comprises a flexible printed circuit board having an electronic component, a connector, a first metallic plate, and a second metallic plate. The electronic component and the connector are mounted to a surface of the side end portion with a lead-free solder. The first metallic plate has a thermosetting adhesive applied thereto and is bonded to a back side of the side end portion in an area which includes the connector. The second metallic plate has the thermosetting adhesive applied thereto and is bonded to the back side of the side end portion in an area which includes the electronic component. The flexible printed circuit board assembly further comprises a reinforcing plate of a synthetic resin which, in an opposed state of the first and second metallic plates fixed to the side end portion of the flexible printed circuit board, is held between the opposed surfaces of the first and second metallic plates and is fixed to the base together with the first and second metallic plates, the holding and fixing of the reinforcing plate being performed after the steps of placing the flexible printed circuit board into a reflow furnace in a state in which the electronic component is mounted on the flexible printed circuit board with a lead-free solder and the first and second metallic plates are bonded to the flexible printed circuit board with the thermosetting adhesive, allowing the lead-free solder to be melted by reflow to solder the electronic component and the connector to the flexible printed circuit board, and allowing the thermosetting adhesive to cure to fix the first and second metallic plates.

Since the rotating disk storage device according to embodiments of the present invention is of a structure wherein, at the time of fixing the FPC to the base of the disk enclosure, the reinforcing plate of a synthetic resin is disposed adjacent the FPC through a metallic plate and is fixed to the base together with the metallic plate, i.e., a structure wherein the reinforcing plate of a synthetic resin is not required to be bonded to the FPC with use of an adhesive, the melting of the solder in the reflow process which is for soldering the electronic component to the wiring pattern can be set higher than that of the reinforcing plate of a synthetic resin. Thus, it becomes possible to use a lead-free solder while taking the environment into account. Moreover, such a structure permits the reflow process to be performed only once.

DETAILED DESCRIPTION OF THE INVENTION

Figure 1:
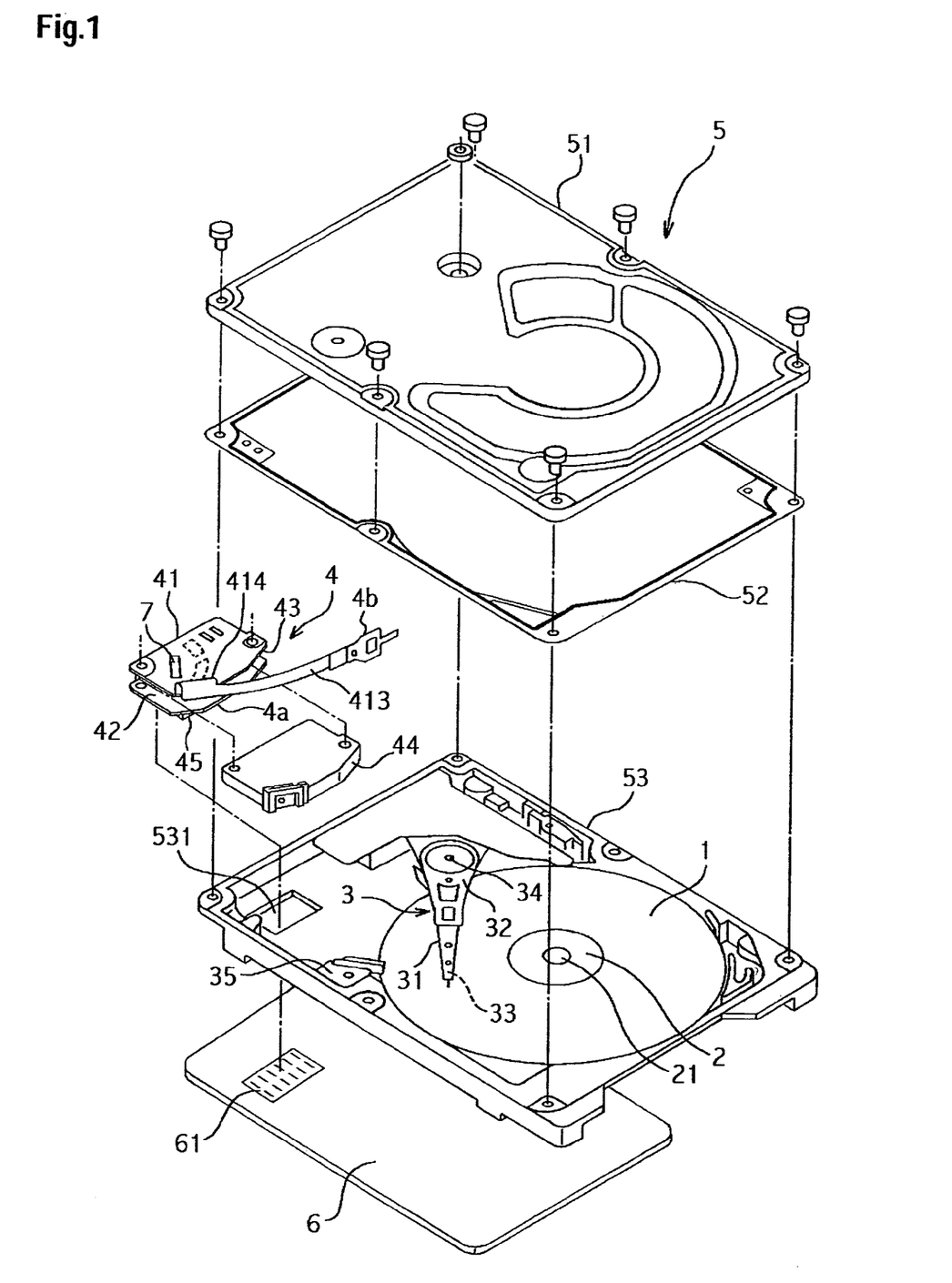
FIG. 1 is an exploded perspective view showing a rotating disk storage device according to an embodiment of the present invention.
Figure 2:
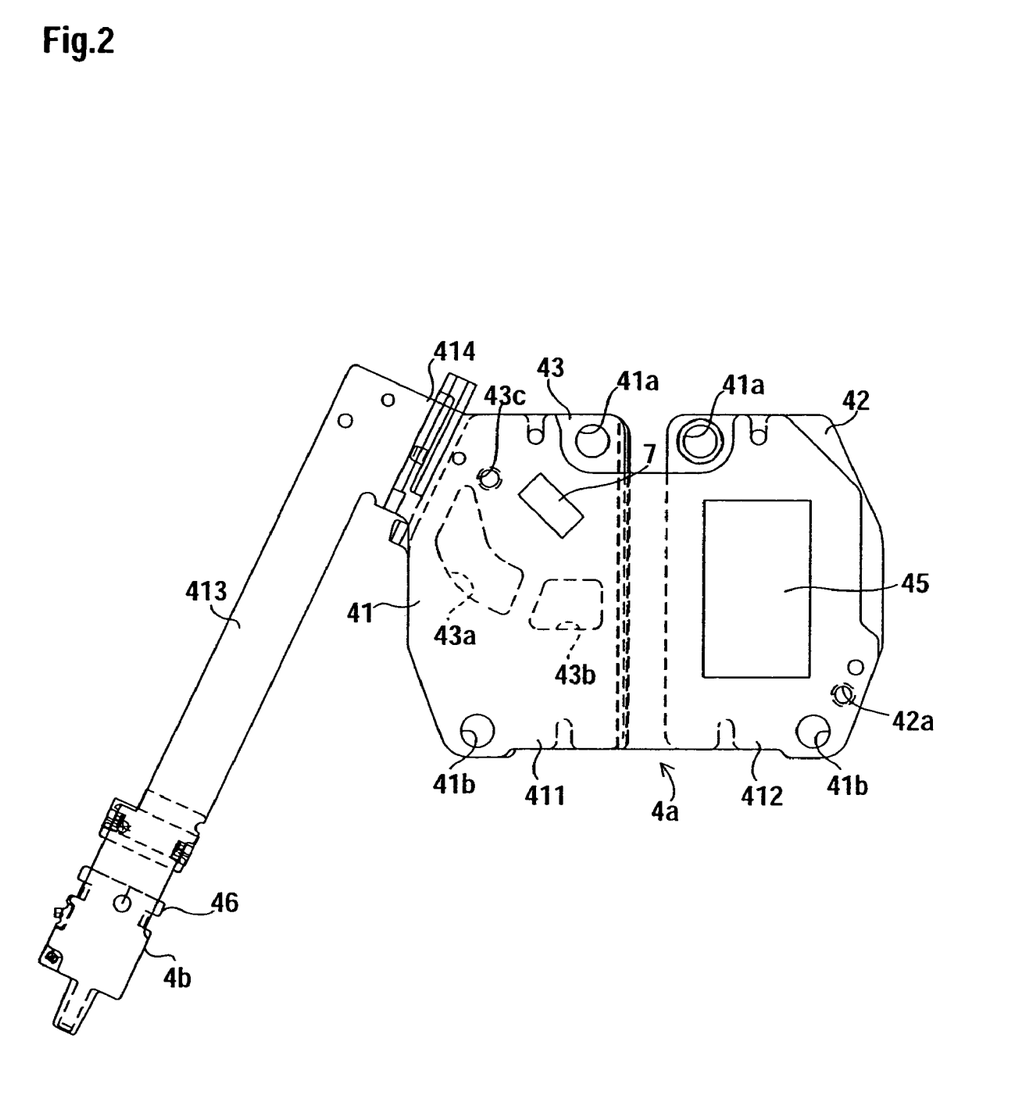
FIG. 2 is a plan view showing an FPC assembly as a main constituent element of the rotating disk storage device of FIG. 1.
Figure 3:
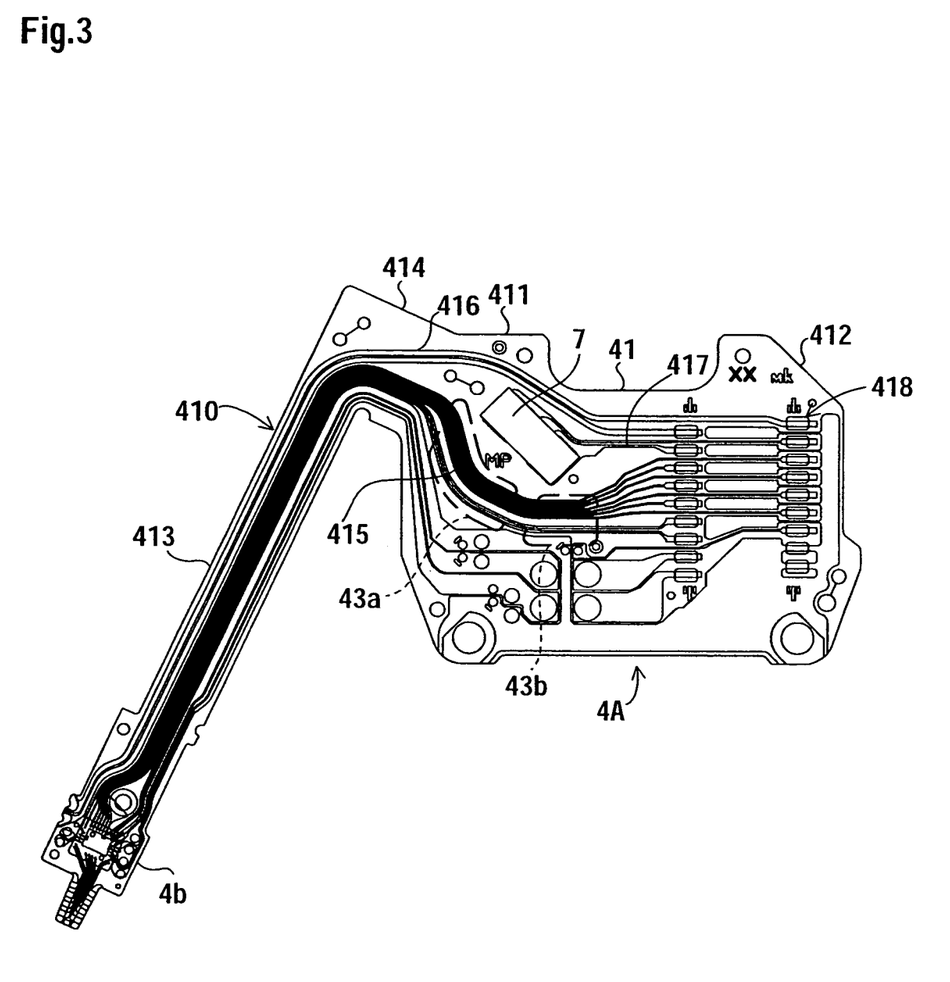
FIG. 3 is an explanatory diagram showing a wiring pattern of an FPC in the FPC assembly as a main constituent element of the rotating disk storage device of FIG. 1.
Figure 4:
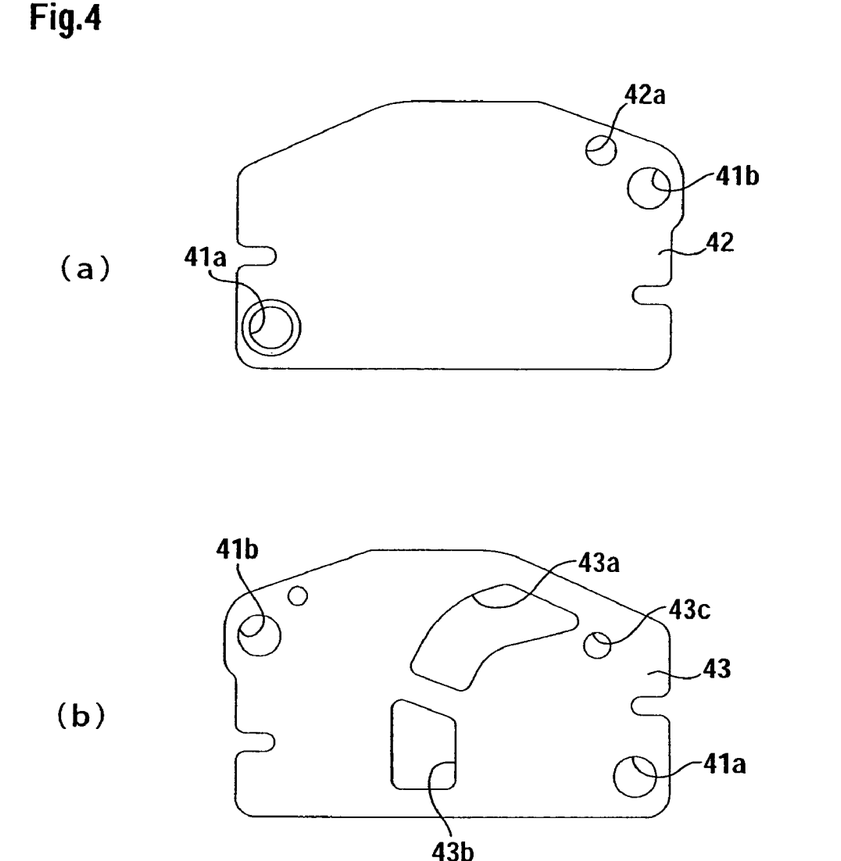
FIG. 4 is an explanatory diagram showing metallic plates which are fixed to the FPC in the FPC assembly as a main constituent of the rotating disk storage device of FIG. 1, in which (a) illustrates a first metallic plate and (b) illustrates a second metallic plate.
Figure 5:
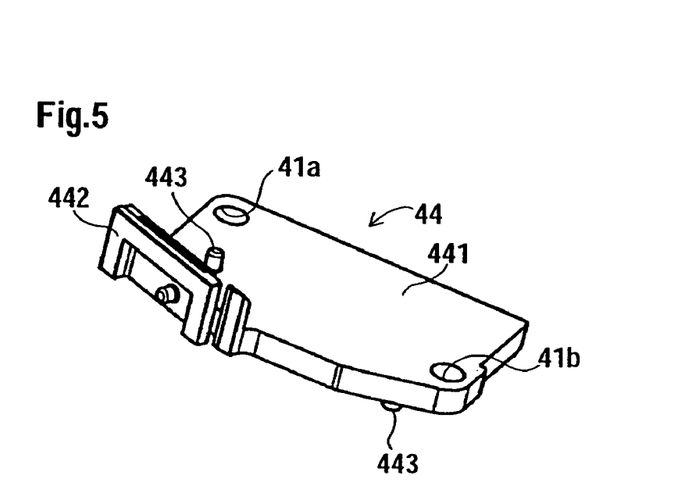
FIG. 5 is a perspective view showing a reinforcing plate of a synthetic resin in the FPC assembly as a main constituent of the rotating disk storage device of FIG. 1.

A rotating disk storage device according to an exemplary embodiment of the present invention will be described hereinbelow with reference to the accompanying drawings. FIG. 1 illustrates a magnetic disk drive in a partially exploded state, FIG. 2 is a developed structural diagram (before bending) of an FPC assembly, FIG. 3 is a developed structural diagram (before bending) showing a wiring pattern formed on the FPC, FIG. 4 is a structural diagram of a first metallic plate and a second metallic plate both fixed to the FPC, and FIG. 5 is a perspective view of reinforcing plate of a synthetic resin as a constituent element of the FPC assembly. In all of the accompanying drawings, the same constituent elements are identified by the same reference numerals.

In a magnetic disk drive as a rotating disk storage device according to an exemplary embodiment of the present invention, as shown in FIG. 1, a magnetic disk 1 as a rotating disk storage medium, a spindle motor 2, an actuator head suspension assembly 3, and an FPC assembly 4 are accommodated within a disk enclosure 5. The disk enclosure 5 comprises a lid 51, a sealing frame 52 and a base 53, the lid 51 being fixed with screws to side walls of the base 53 through the sealing frame 52, and a logic card (circuit board) 6 for controlling the operation of the magnetic disk drive and also for controlling read and write of data is attached to an outer surface (lower surface) of the disk enclosure 5. A connector connecting pattern 61 is formed on the circuit board 6.

The magnetic disk 1 is fixed to an outer periphery of a spindle shaft 21 of the spindle motor 2 which is erected on the base 53 of the disk enclosure 5. The actuator head suspension assembly 3 is composed of a head suspension assembly (HSA) 31 and an actuator assembly 32. A head 33 for read and/or write of data from and/or to the magnetic disk 1 is attached to a tip, or distal end, of the HSA 31. The actuator assembly 32 is made up of an actuator arm (not shown) which supports the HSA 31, a bearing portion of a pivot shaft 34, and a voice coil motor (VCM) (not shown). The VCM is made up of a coil support, a voice coil supported by the coil support, and a yoke.

A ramp 35 is disposed near the magnetic disk 1. When the rotation of the magnetic disk 1 is to be stopped, the ramp 35 functions to provide a slide surface to a margin lip (not shown) attached to the tip of the HSA 31 and allow the head 33 to be retracted. As shown in FIGS. 1 and 2, the FPC assembly 4 has an FPC 41, a first metallic plate 42, a second metallic plate 43, and a reinforcing plate 44 of a synthetic resin. One side end portion 4a of the FPC assembly 4 is fixed to the base 53 of the disk enclosure 5, while an opposite side end portion 4b is fixed to the actuator head suspension assembly 3.

In the FPC 41, an electronic component mounting portion 411 and a connector mounting portion 412 are formed at one side end portion 4a, and the electronic component mounting portion 411 and the opposite side end portion 4b are connected together through a band-like flexible portion 413. The electronic component mounting portion 411, the connector mounting portion 412, the band-like flexible portion 413, and the one side end portion 4a constitute an integrally-formed flat cable. The opposite side end portion 4b is connected to one end of the band-like flexible portion 413, while an opposite end of the band-like flexible portion 413 is connected in L shape to the electronic component mounting portion 411 through a connection 414. On the FPC 41, as shown in FIG. 3, there is formed a wiring pattern 410, including a signal line 415 for the transmission of a signal of data read by the head 33 which is attached to the tip end of the HSA 31 and a VCM power line 416 for connection to the voice coil of the VCM. More specifically, a conductive film is affixed to a base film with use of an adhesive and is patterned in a predetermined shape to form the wiring pattern 410. The wiring pattern 410 is insulated on the FPC 41 except portions which permit electric connections.

The wiring pattern 410 has a sensor signal line 417 for electric connection by soldering of a shock sensor 7 which is for preventing malfunction of the magnetic disk drive. The shock sensor 7 is disposed on a surface of the electronic component mounting portion 411. On the other hand, on a surface of the connector mounting portion 412 of the FPC 41 there are formed connector pad electrodes 418 as apertures which are electrically connected to the wiring pattern 410. Further, a connector 45 for connecting the wiring pattern 410 to the circuit board 6 (see FIG. 1) is soldered to the connector pad electrodes 418. More specifically, a connector inserting aperture 531 is formed in the base 53, and by inserting the connector 45 into the connector inserting aperture 531, the connector 45 can be connected electrically to the connector connecting pattern 61 on the circuit board 6.

A reinforcing member 46 is fixed to a back side of a tip position of the opposite side end portion 4b. As shown in FIGS. 1 and 2, the first metallic plate 42 (FIG. 4(a)) is fixed to a back side of the connector mounting portion 412 of the FPC 41 and the second metallic plate 43 (FIG. 4(b)) is fixed to a back side of the electronic component mounting portion 411 of the FPC, using a thermosetting adhesive for example. As the thermosetting adhesive there is used an epoxy resin for example. In the second metallic plate 43, as shown in FIGS. 2, 3 and 4(b), for example two apertures 43a and 43b are formed in the electronic component mounting portion 411 of the FPC 41 in an area which covers the signal line 415 in the wiring pattern 410. With these apertures, when the metallic plates are disposed in proximity to the wiring pattern through which feeble signals pass, it is possible to prevent deterioration in the transfer characteristic of data caused by a change in transmission impedance of the wiring pattern.

The first and second metallic plates 42, 43 fixed to the back sides of the connector mounting portion 412 and the electronic component mounting portion 411, respectively, are opposed to each other and the reinforcing plate 44 of a synthetic resin is held between the opposed metallic plates and is fixed to the base 53 of the disk enclosure 5 together with both metallic plates 42 and 43. As shown in FIG. 5, the reinforcing plate 44 of a synthetic resin has a substantially plate-like fixing portion 441 for positioning with respect to the base 53 and a posture maintaining portion 442 for orienting and maintaining the posture of the band-like flexible portion 413 of the FPC 41 so as to conduct the opposite side end portion 4b in a predetermined direction. As a suitable example of the synthetic resin there is mentioned a polyether imide [trade name: ULTEM®]. The posture maintaining portion 442 is erected at an end portion with respect to the fixing portion 441. At the posture maintaining portion 442, the connection 414 for connecting the band-like flexible portion 413 of the FPC 41 in L shape to the electronic component mounting portion 411 is bent in U shape and is fixed. For the fixing there may be adopted any of various known methods such as, for example, using an adhesive or pinching the connection 414. By such U-shape bending of the connection 414, surfaces of the band-like flexible portion 413 and the opposite side end portion 4b can be substantially perpendicular to the base 53, so that even upon pivotal motion of the actuator head suspension assembly 3, it is possible to let the band-like flexible portion 413 follow the pivotal motion without any compulsion.

The FPC assembly 4 has fitting portions. When the first and second metallic plates 42, 43 fixed to the back sides of the connector mounting portion 412 and the electronic component mounting portion 411, respectively, are opposed to each other and the reinforcing plate 44 of a synthetic resin is held between the opposed faces of the metallic plates, the reinforcing plate 44 and the first and second metallic plates 42, 43 are mutually connected through the said fitting portions. As the fitting portions, as shown in FIGS. 4 and 5, positioning pins 443 are erected respectively on a surface and a back side of the reinforcing plate 44 of a synthetic resin, while positioning holes 42a and 43c are formed through the first and second metallic plates 42, 43 so as to be fitted on the positioning pins 443 of the reinforcing plate 44 when the reinforcing plate is held between the opposed faces of both metallic plates 42 and 43. The positioning pins 443 and the positioning holes 42a, 43c are formed in such a manner that once they are fitted together, the fitted state is not easily released. For fixing the FPC 41 to the base 53 with screws after thus-holding the reinforcing plate 44 of a synthetic resin between the opposed faces of the first and second metallic plates 42, 43, tapped holes 41a and 41b are formed through the reinforcing plate 44 and the first and second metallic plates 42, 43. The base 53 and the first and second metallic plates 42, 43 are electrically connected together through a metallic screw. This is for the following reason. When the second metallic plate 43 is fixed to the back side of the electronic component mounting portion 411, there may occur a noise in the data signal passing through the signal line 415 in the wiring line 410 and therefore the FPC assembly 4 is earthed to eliminate the noise.

The following description is now provided about a manufacturing process for the FPC assembly 4 in the magnetic disk drive constructed as above. It is here assumed that the FPC 41 has already gone through patterning of the wiring pattern 410. The first metallic plate 42 is bonded to the back side of the connector mounting portion 412 as one side end portion 4a of the FPC 41 with use of a thermosetting adhesive and the second metallic plate 43 is bonded to the back side of the electronic component mounting portion 411 with use of the thermosetting adhesive. Next, using a pasty lead-free solder, the connector 45 is mounted to the connector pad electrodes 418 formed as apertures on the surface of the connector mounting portion 412. Moreover, a transmission signal amplifying AE signal, as well as resistors and capacitors, are mounted to predetermined positions of the wiring pattern 410 from the surface of the electronic component mounting portion 411 with use of a pasty lead-free solder. Further, the shock sensor 7 is mounted to the sensor signal line 417 from the surface of the electronic component mounting portion 411 with use of a pasty lead-free solder.

The FPC 41 with such various electronic components mounted thereon and the metallic plates bonded thereto is placed into a reflow furnace and is heated at a temperature of about 220° to 230° C., resulting in the lead-free solder being melted, whereby the AE chip, resistors, capacitors, and shock sensor 7 can be soldered to the surface of the electronic component mounting portion 411. Further, since the thermosetting adhesive cures in this reflow process, the first and second metallic plates 42, 43 can be fixed respectively to the back side of the connector mounting portion 412 and the back side of the electronic component mounting portion 411. The reinforcing member 46 is fixed to the back side of the tip position of the opposite side end portion 4b.

Then, the first and second metallic plates 42, 43 fixed respectively to the back sides of the connector mounting portion 412 and the electronic component mounting portion 411 are brought into opposition to each other and the reinforcing plate 44 of a synthetic resin is held between the opposed faces of both metallic plates. At this time, the first and second metallic plates 42, 43 and the reinforcing plate 44 of a synthetic resin are established in their positions by the positioning pins 443 and positioning holes 42a, 43a as fitting portions, and this fitted state is not easily released.

After the reinforcing plate 44 of a synthetic resin has been held between the opposed faces of the first and second metallic plates 42, 43 and when the FPC assembly 4 is fixed to the base 53, the surface of the opposite side end portion 4b of the FPC 41 is to be made substantially perpendicular to the base 53. To this end, the connection 414 for connecting the band-like flexible portion 413 of the FPC 41 in L shape to the electronic component mounting portion 411 is bent in U shape at the posture maintaining portion 442 of the reinforcing plate 44 of a synthetic resin and is fixed.

Because of such a structure which does not require the reinforcing plate 44 of a synthetic resin to be bonded to the FPC 41 with use of an adhesive, the melting point of solder in the reflow process for soldering the electronic components to the wiring pattern 410 can be set higher than that of the reinforcing plate 44. Even if there is used a lead-free solder, the FPC assembly 4 can be assembled by only a single reflow process.

When the FPC assembly 4 thus assembled is fixed with screws to a predetermined position on the base 53 of the disk enclosure 5, the connector 45 fixed to the connector pad electrodes 418 on the surface of the connector mounting portion 412 of the FPC 41 is inserted into the connector inserting aperture 531 formed in the base 53, and by fixing the circuit board 6 to the base 53 it is possible to let the connector 45 and the connector connecting pattern 61 on the circuit board 6 be connected together electrically.

Next, a description will be given below of experimental results on a positioning accuracy (shock sensitivity) of the actuator assembly 32 relative to the magnetic disk 1 in the magnetic disk drive with the FPC assembly 4 built therein.

The magnetic disk drive was set to an oscillation tester capable of generating oscillation in both horizontal and vertical directions. In accordance with a control program provided in the tester, the head 33 in the actuator head suspension assembly 3 was stopped in a floating state above the magnetic disk and was measured for positioning accuracy. More specifically, the measurement involves measuring a positioning accuracy of the actuator assembly 32 which changes upon receipt of a sensor signal from the shock sensor 7. A comparison was made between magnetic disk drives with the FPC assembly 4 according to the present embodiment incorporated therein and conventional, presently available magnetic disk drives incorporating therein an FPC assembly with electronic components soldered thereto using a eutectic solder. In each of the magnetic disk drives, the FPC assembly is fixed so as to face in the same direction at the same position with respect to the base of the disk enclosure.

Figure 6:
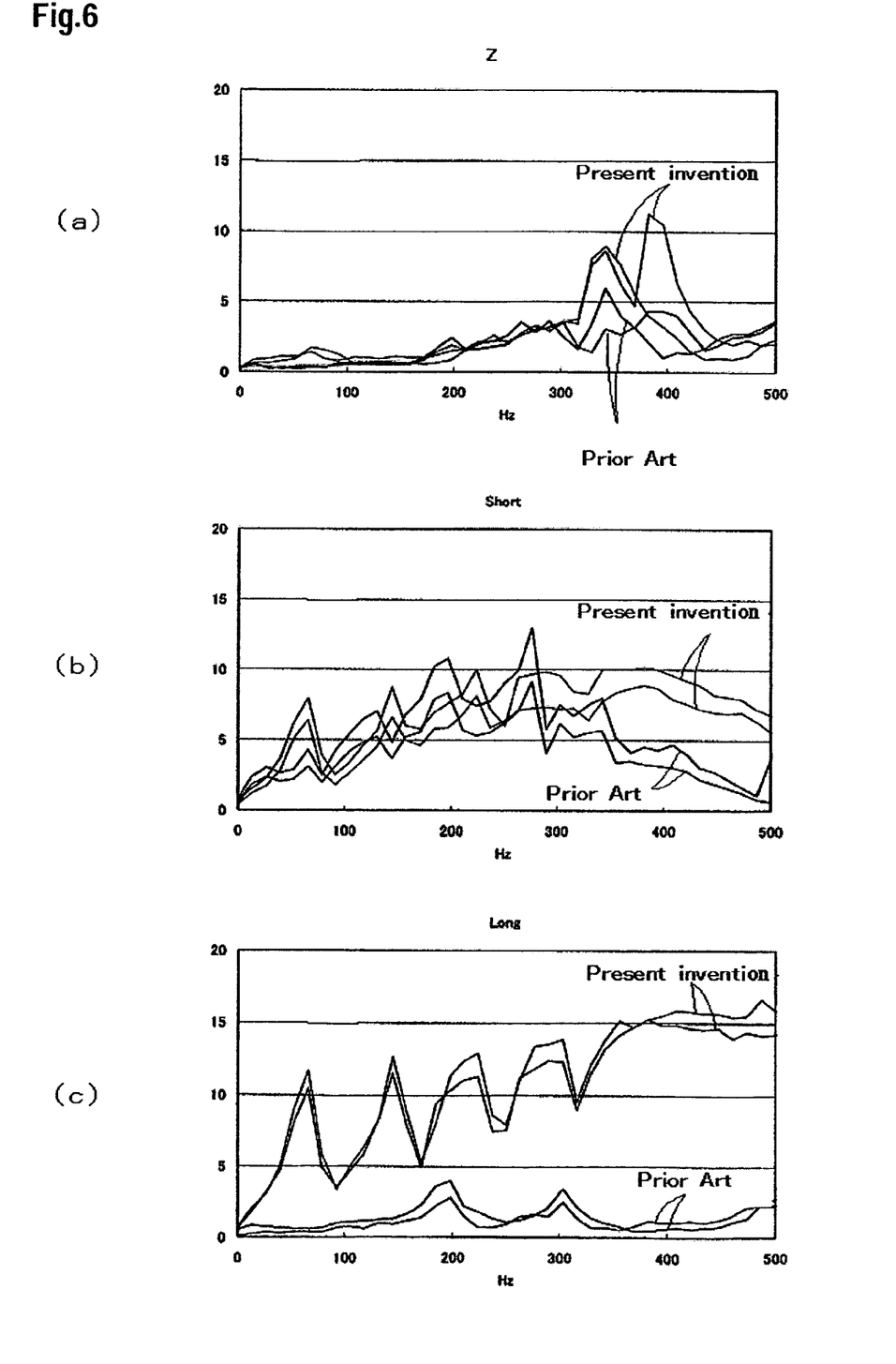
FIG. 6 is a waveform diagram showing a comparison between a positioning accuracy of rotating disk storage devices according to the present embodiment and that of conventional, presently available rotary disk storage devices.

Measurement results are shown in FIGS. 6(*a*), (*b*) and (*c*), from which it is seen that the magnetic disk drives according to the present embodiment are almost equal or superior in positioning accuracy to the conventional, present available magnetic disk drives. In FIG. 6, (a) shows the result of measurement obtained under oscillation generated in the vertical direction, (b) shows the result of measurement obtained under oscillation generated in the long-side direction of the magnetic disk drive, and (c) shows the result of measurement obtained under oscillation generated in the short-side direction of the magnetic disk drive. In the same figure, the axis of ordinate represents the positioning accuracy of the actuator assembly and the axis abscissa represents the degree of shock. In the axis of ordinate direction, the larger the numerical value, the poorer the positioning accuracy.

Further, regarding the case where the second metallic plate 43 is fixed to the back side of the electronic component mounting portion 411 in the FPC 41, an experiment was conducted to check the influence thereof on data signal.

A comparison was made between the case where the second metallic plate 43 and the disk enclosure 5 are fixed in an electrically connected state and the case where both are fixed in an insulated state.

Figure 7:
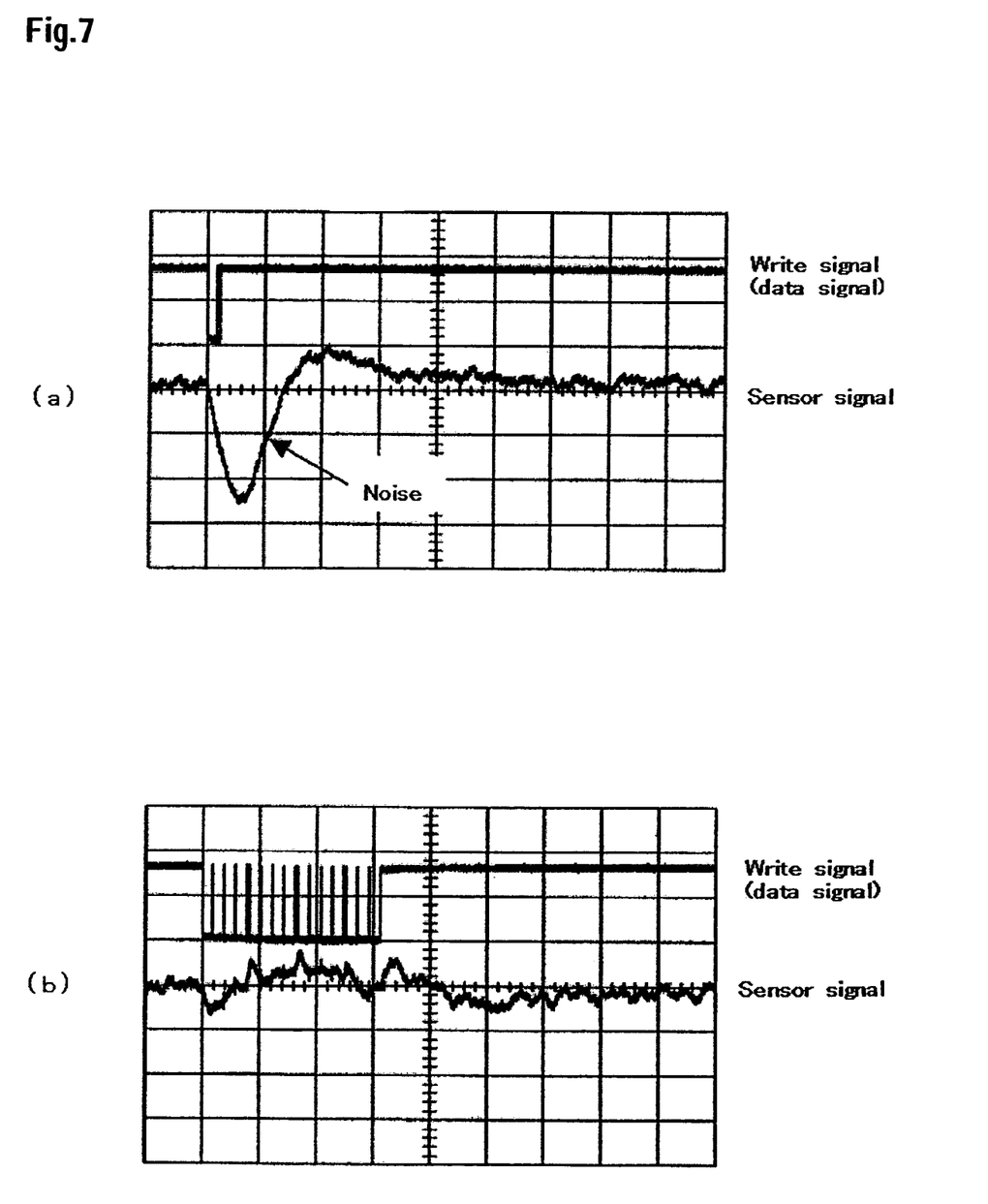
FIG. 7 is a waveform diagram showing a comparison between a case where the second metallic plate in the FPC assembly as a main constituent element of the rotating disk storage device according to the present embodiment and a disk enclosure are fixed in an electrically connected state and fixed and a case where both are fixed in an insulated state.

Measurement results are shown in FIG. 7(*a*). As is seen from the same figure, when the second metallic plate 43 and the disk enclosure 5 are fixed in an insulated state, a noise enters the sensor signal provided from the shock sensor 7, so that the data signal turns OFF from the state of write. On the other hand, when the second metallic plate 43 and the disk enclosure 5 are fixed in an electrically connected state, it is possible to eliminate noise from the sensor signal provided from the shock sensor 7, so that the data signal does not turn OFF, but the state of write can be continued.

Figure 8:
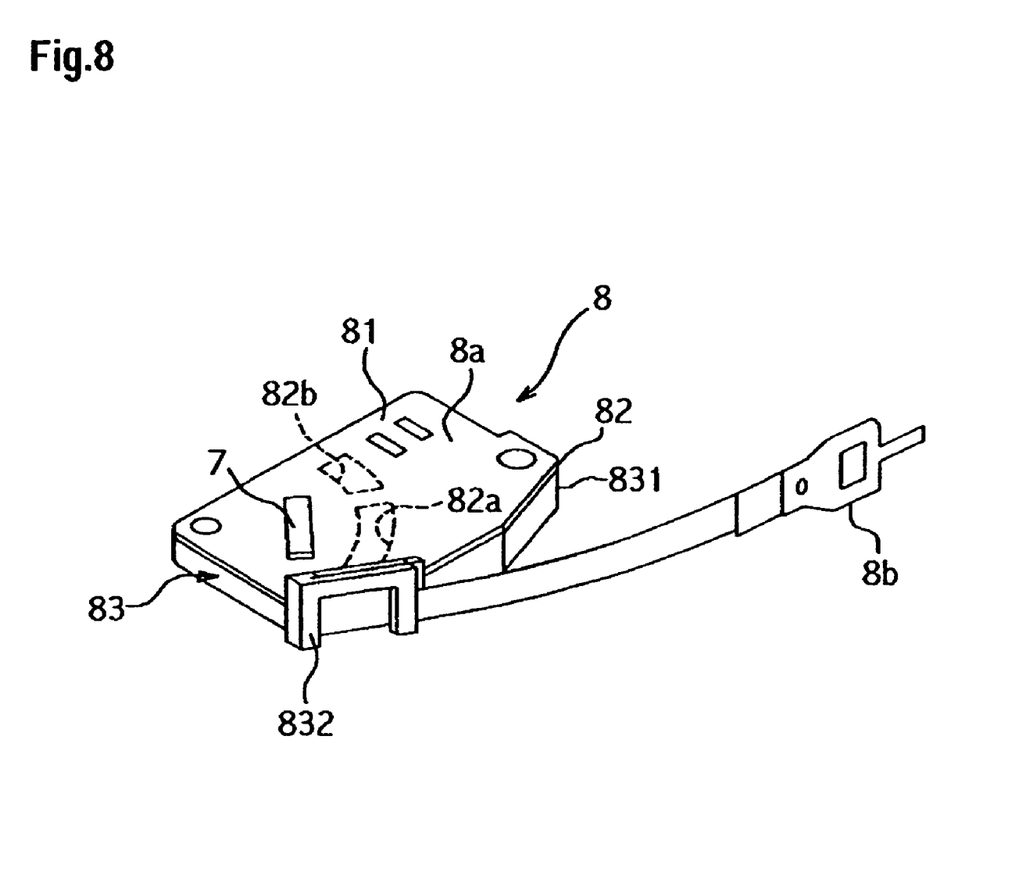
FIG. 8 is a perspective view showing the whole of an FPC assembly as a main constituent element of a rotating disk storage device according to another embodiment of the present invention.

The FPC assembly 4 used in the above embodiment comprises the FPC 41, the first and second metallic plates 42, 43, and the reinforcing plate 44 of a synthetic resin, and in the above embodiment, the first and second metallic plates 42, 43 are put in opposition to each other and the reinforcing plate 44 of a synthetic resin is held between the opposed faces of both metallic plates and is fixed to the base 53. However, no limitation is made thereto, but there may be used such an FPC assembly 8 as shown in FIG. 8, which FPC assembly 8 comprises a metallic plate 82 fixed to one side end portion of an FPC 81 and a reinforcing plate 83 of a synthetic resin, the reinforcing plate 83 being disposed adjacent the metallic plate 82 and fixed to the base 53 (see FIG. 1) together with the metallic plate 82.

In the FPC assembly 8, as in the FPC assembly 4 described above, the metallic plate 82 is fixed to one side end portion 8*a* of the FPC 81 with use of a thermosetting adhesive, and the shock sensor 7 is connected to a wiring pattern (not shown) in the area where the metallic plate 82 is fixed. The reinforcing plate 83 of a synthetic plate has a fixing portion 831 for positioning with respect to the base 53 and a posture maintaining portion 832 for orienting and maintaining the posture of the FPC 81 so as to conduct an opposite side end portion 8*b* of the FPC 81 in a predetermined direction. Further, there are formed fitting portions (not shown) for mutual engagement of the reinforcing plate 83 and the metallic plate 82. The metallic plate 82 has apertures 82*a* and 82*b* in an area which covers a signal line in the wiring pattern of the FPC 81.

According to the FPC assembly 8 constructed as above, since the basis construction is the same as that of the FPC assembly 4, there can be obtained almost the same effects as in the FPC assembly 4.

Although in the above embodiments reference has been made to the magnetic disk drive of a load/unload type, no limitation is made thereto. Even in a magnetic disk drive of a CSS (Contact Start Stop) type wherein a magnetic disk is provided with a retraction area and an actuator head suspension assembly causes a head to be retracted to the retraction area, it is possible to use each of the FPC assemblies 4 and 8 described above.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A rotating disk storage device comprising:
    a disk enclosure including a base;
    a rotating disk storage medium supported rotatably on said base;
    an actuator head suspension assembly having a head for reading data from said rotating disk storage medium;
    a flexible printed circuit board having a wiring pattern which includes a signal line for transmission of a signal of said data read by said head, said flexible printed circuit board having a side end portion fixed to said base;
    a metallic plate fixed to said side end portion of said flexible printed circuit board;
    an electronic component comprising a shock sensor and disposed on said flexible printed circuit board in an area where said metallic plate is fixed, said electronic component being connected to said wiring pattern; and
    a reinforcing plate of a synthetic resin disposed adjacent said metallic plate and fixed to said base together with said metallic plate.

2. A rotating disk storage device according to claim 1, wherein said electronic component is connected to said wiring pattern by reflow of a lead-free solder.

3. A rotating disk storage device comprising:
a disk enclosure including a base;
a rotating disk storage medium supported rotatably on said base;
an actuator head suspension assembly having a head for reading data from said rotating disk storage medium;
a flexible printed circuit board having a wiring pattern which includes a signal line for transmission of a signal of said data read by said head, said flexible printed circuit board having a side end portion fixed to said base;
a metallic plate fixed to said side end portion of said flexible printed circuit board;
an electronic component disposed on said flexible printed circuit board in an area where said metallic plate is fixed, said electronic component being connected to said wiring pattern; and
a reinforcing plate of a synthetic resin disposed adjacent said metallic plate and fixed to said base together with said metallic plate,
wherein said metallic plate is fixed to said side end portion with a thermosetting adhesive.

4. A rotating disk storage device according to claim 1, wherein said reinforcing plate of a synthetic resin has a fixing portion for positioning with respect to said base and a posture maintaining portion for orienting and maintaining the posture of said flexible printed circuit board.

5. A rotating disk storage device according to claim 1, wherein said reinforcing plate of a synthetic resin and said metallic plate have respective fitting portions for mutual engagement.

6. A rotating disk storage device according to claim 1, wherein said synthetic resin comprises a polyether imide.

7. A rotating disk storage device according to claim 1, wherein said metallic plate has an aperture in an area which covers said signal line included in said wiring pattern on said flexible printed circuit board.

8. A rotating disk storage device according to claim 1, wherein said metallic plate and said disk enclosure are connected together electrically.

9. A rotating disk storage device comprising:
a disk enclosure including a base;
a rotating disk storage medium supported rotatably on said base;
an actuator head suspension assembly having a head for reading data from said rotating disk storage medium;
a flexible printed circuit board having a wiring pattern which includes a signal line for transmission of a signal of said data read by said head, said flexible printed circuit board having a side end portion fixed to said base;
a first metallic plate and a second metallic plate both fixed to said side end portion of said flexible printed circuit board;
a connector disposed on said flexible printed circuit board in an area where said first metallic plate is fixed, said connector being connected to said wiring pattern;
an electronic component disposed on said flexible printed circuit board in an area where said second metallic plate is fixed, said electronic component being connected to said wiring pattern; and
a reinforcing plate of a synthetic resin which, in an opposed state of said first and second metallic plates fixed to said side end portion of said flexible printed circuit board, is held between the opposed surfaces of the first and second metallic plates and is fixed to said base together with the first and second metallic plates.

10. A rotating disk storage device according to claim 9, wherein said electronic component comprises a shock sensor.

11. A rotating disk storage device according to claim 9, wherein said electronic component is connected to said wiring pattern by reflow of a lead-free solder.

12. A rotating disk storage device according to claim 9, wherein said first and second metallic plates are fixed said side end portion with a thermosetting adhesive.

13. A rotating disk storage device according to claim 9, wherein said reinforcing plate of a synthetic resin has a fixing portion for positioning with respect to said base and a posture maintaining portion for orienting and maintaining the posture of said flexible printed circuit board.

14. A rotating disk storage device according to claim 9, wherein said reinforcing plate of a synthetic resin and said first and second metallic plates have respective fitting portions for mutual engagement.

15. A rotating disk storage device according to claim 9, wherein said synthetic resin comprises a polyether imide.

16. A rotating disk storage device according to claim 9, wherein said second metallic plate has an aperture in an area which covers said signal line included in said wiring pattern on said flexible printed circuit board.

17. A rotating disk storage device according to claim 9, wherein said second metallic plate and said disk enclosure are connected together electrically.

18. A rotating disk storage device comprising a flexible printed circuit board assembly having a wiring pattern and a side end portion fixed to a base of a disk enclosure, said wiring pattern being adapted to transmit a signal of data read by a head from a rotating disk storage medium, said rotating disk storage medium being supported on said base rotatably, said flexible printed circuit board assembly comprising:
a flexible printed circuit board having an electronic component and a metallic plate, said electronic component being mounted to a surface of said side end portion with a lead-free solder, said metallic plate having a thermosetting adhesive applied thereto and being bonded to a back side of said side end portion in an area which includes said electronic component; and
a reinforcing plate of a synthetic resin, said reinforcing plate being disposed adjacent said metallic plate which is in a fixed state and being fixed to said base together with said metallic plate, said disposing and fixing of said reinforcing plate being performed after the steps of placing said flexible printed circuit board into a reflow furnace in a state in which said electronic component is mounted on the flexible printed circuit board with a lead-free solder and said metallic plate is bonded to the flexible printed circuit board with said thermosetting adhesive, allowing said lead-free solder to be melted by reflow to solder said electronic component to the flexible printed circuit board, and allowing said thermosetting adhesive to cure to fix said metallic plate.

19. A rotating disk storage device comprising a flexible printed circuit board assembly having a wiring pattern and a side end portion fixed to a base of a disk enclosure, said wiring pattern being adapted to transmit a signal of data read by a head from a rotating disk storage medium, said rotating disk storage medium being supported on said base rotatably, said flexible printed circuit board assembly comprising:
a flexible printed circuit board having an electronic component, a connector, a first metallic plate, and a second metallic plate, said electronic component and said connector being mounted to a surface of said side end portion with a lead-free solder, said first metallic plate having a thermosetting adhesive applied thereto and being bonded to a back side of said side end portion in an area which includes said connector, said second metallic plate having said thermosetting adhesive applied thereto and being bonded to the back side of said side end portion in an area which includes said electronic component; and a reinforcing plate of a synthetic resin which, in an opposed state of said first and second metallic plates fixed to said side end portion of said flexible printed circuit board, is held between the opposed surfaces of the first and second metallic plates and is fixed to said base together with the first and second metallic plates, said holding and fixing of said reinforcing plate being performed after the steps of placing said flexible printed circuit board into a reflow furnace in a state in which said electronic component is mounted on the flexible printed circuit board with a lead-free solder and said first and second metallic plates are bonded to the flexible printed circuit board with said thermosetting adhesive, allowing said lead-free solder to be melted by reflow to solder said electronic component and said connector to the flexible printed circuit board, and allowing said thermosetting adhesive to cure to fix said first and second metallic plates.

* * * * *